United States Patent [19]

Hongu et al.

[11] 4,110,635

[45] Aug. 29, 1978

[54] AMPLIFYING CIRCUIT

[75] Inventors: Masayuki Hongu, Komae; Masaharu Tokuhara, Tokyo; Hiromi Kawakami, Yokohama, all of Japan

[73] Assignee: Sony Corporation, Tokyo, Japan

[21] Appl. No.: 715,630

[22] Filed: Aug. 18, 1976

[30] Foreign Application Priority Data

Aug. 19, 1975 [JP] Japan ................. 50-100291

[51] Int. Cl.$^2$ .................... H03K 5/00; H03K 9/06
[52] U.S. Cl. ................... 307/233 R; 307/230; 328/133
[58] Field of Search ................ 307/230, 233 R; 328/133

[56] References Cited

U.S. PATENT DOCUMENTS

| 3,760,185 | 9/1973 | Green | 307/230 |
| 3,760,197 | 9/1973 | Dana | 307/230 |

Primary Examiner—John S. Heyman
Attorney, Agent, or Firm—Lewis H. Eslinger; Alvin Sinderbrand

[57] ABSTRACT

An amplifier provides a complete video and sound I.F. signal to a synchronous detector switching circuit, and the switching signal to be applied to the switching circuit is obtained from the same amplifier by connecting a grounded base stage, with its emitter impedance, in series with the amplifier load. The grounded base stage has a load tuned to the I.F. carrier frequency, and the filtered signal from the grounded base is the signal applied as the switching signal to the synchronous detector switching circuit.

7 Claims, 3 Drawing Figures

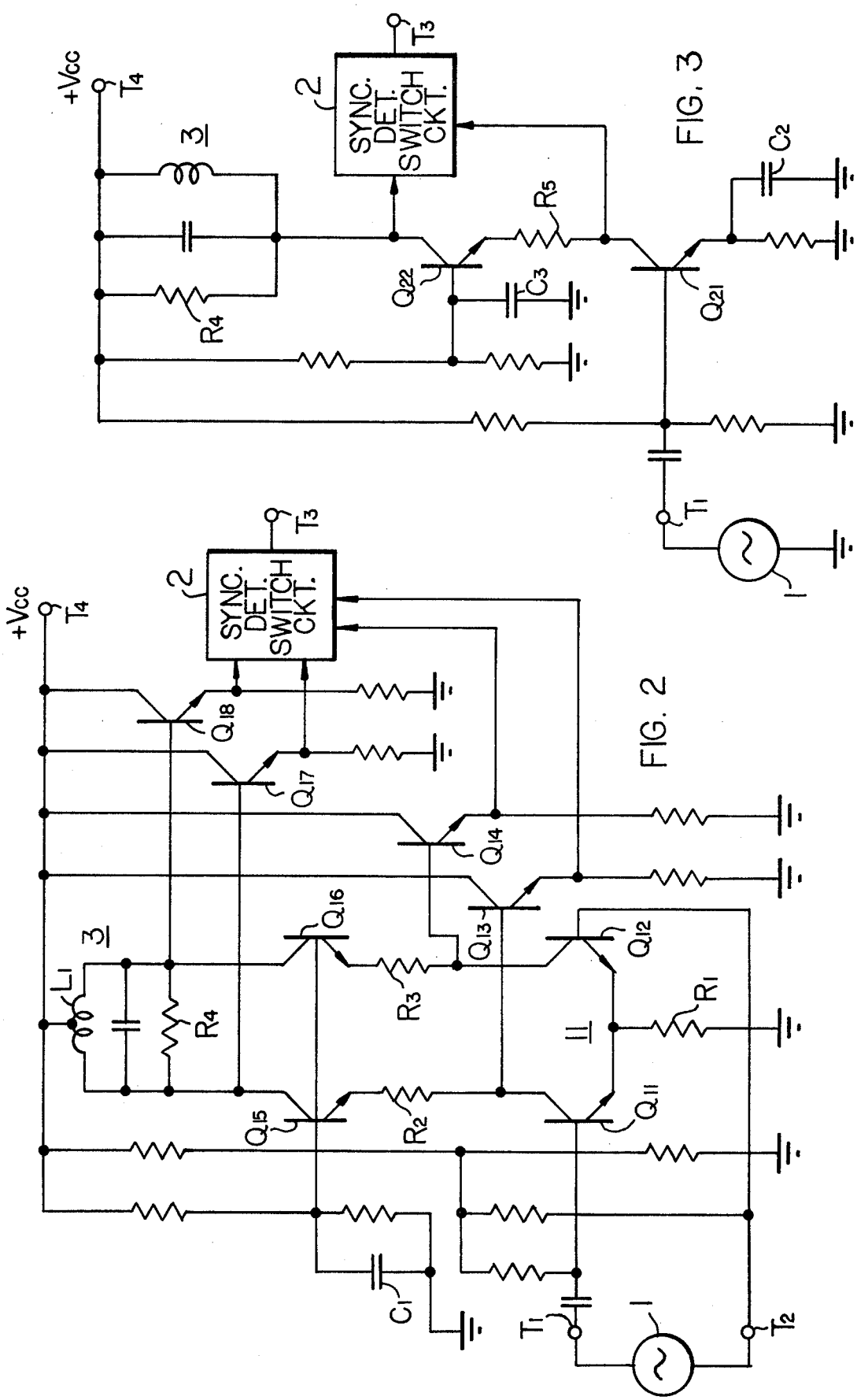

AMPLIFYING CIRCUIT

BACKGROUND OF THE INVENTION

1. Field of the Invention

This invention relates to an amplifying circuit, and in particular it relates to an amplifying circuit for obtaining two input signals for a synchronous video detector in a television receiver.

2. Description of the Prior Art

In the past a diode detector or a transistor detector has usually been used as a video detector in a television receiver. However, such detectors have the disadvantage that their input-output characteristic is nonlinear due to the nonlinearity of the diode or the transistor. Because of this nonlinearity, if a video intermediate frequency (IF) signal and a sound IF signal are supplied to the detector, the resulting output signal not only includes a video signal and sound IF signal having a carrier frequency of 4.5 MHz, but in addition a beat signal at a frequency of 920 KHz, which is the frequency difference of the 4.5 MHz sound IF signal and the color signal of 3.58 MHz. Many other harmonic signals are also produced, but the frequencies of these harmonic signals are outside of the video frequency band, so they have no adverse influence on the reproduced image. The 920 KHz beat signal is within the video frequency band and is therefore reproduced in the image as a noise signal. In order to eliminate the beat noise signal, it has previously been proposed either to connect in the video signal path a trap circuit tuned to the frequency of the beat signal, or to avoid supplying a sound IF signal at the original intermediate frequency to the video detector. The first of these two proposals decreases the quality of the frequency characteristic of the video signal, and the second proposal makes it necessary to provide another detecting circuit in order to obtain a sound IF signal having a carrier frequency of 4.5 MHz.

It has also been proposed to use a synchronous video detector in order to eliminate the foregoing advantages. By using a synchronous video detector, it is possible to eliminate the above defects, but the resultant circuit requires many components, and it is very difficult to fabricate it in an integrated circuit.

SUMMARY OF THE INVENTION

In accordance with the present invention, the IF signal, which includes both video and sound components, is applied to an amplifier stage. This stage may be either single-ended or a differential amplifier, for example. The amplified output signal, which still includes both video and sound components, is applied to a switching circuit that acts as a synchronous detector. A grounded base transistor amplifier is connected in series between the load impedance (or load impedances, in the case of a differential amplifier) and the power supply terminal. The grounded base amplifier has a tuned load circuit that is tuned to the IF carrier, and the filtered output signal is applied to the switching input terminal of the same synchronous detector switching circuit.

As is standard practice for synchronous detectors the switching signal samples the signal to be rectified and produces an output signal that corresponds to the amplitude of the sampled signal. Since the switching signal is derived from the same signal to be switched, it is inherently synchronous with the signal to be switched.

By connecting a grounded base amplifier in the manner just described to amplify primarily the IF carrier, the low emitter impedance of that type of amplifier does not interfere with the operation of the amplifier that amplifies the complete IF signal. Fewer components are required than in prior art circuits, which makes it easier to produce the complete system as an integrated circuit.

BRIEF DESCRIPTION OF THE DRAWINGS

FIG. 2 is a schematic circuit diagram of one embodiment of this invention.

FIG. 3 is a schematic circuit diagram of another embodiment of this invention.

DESCRIPTION OF THE PREFERRED EMBODIMENTS

Figure 1:
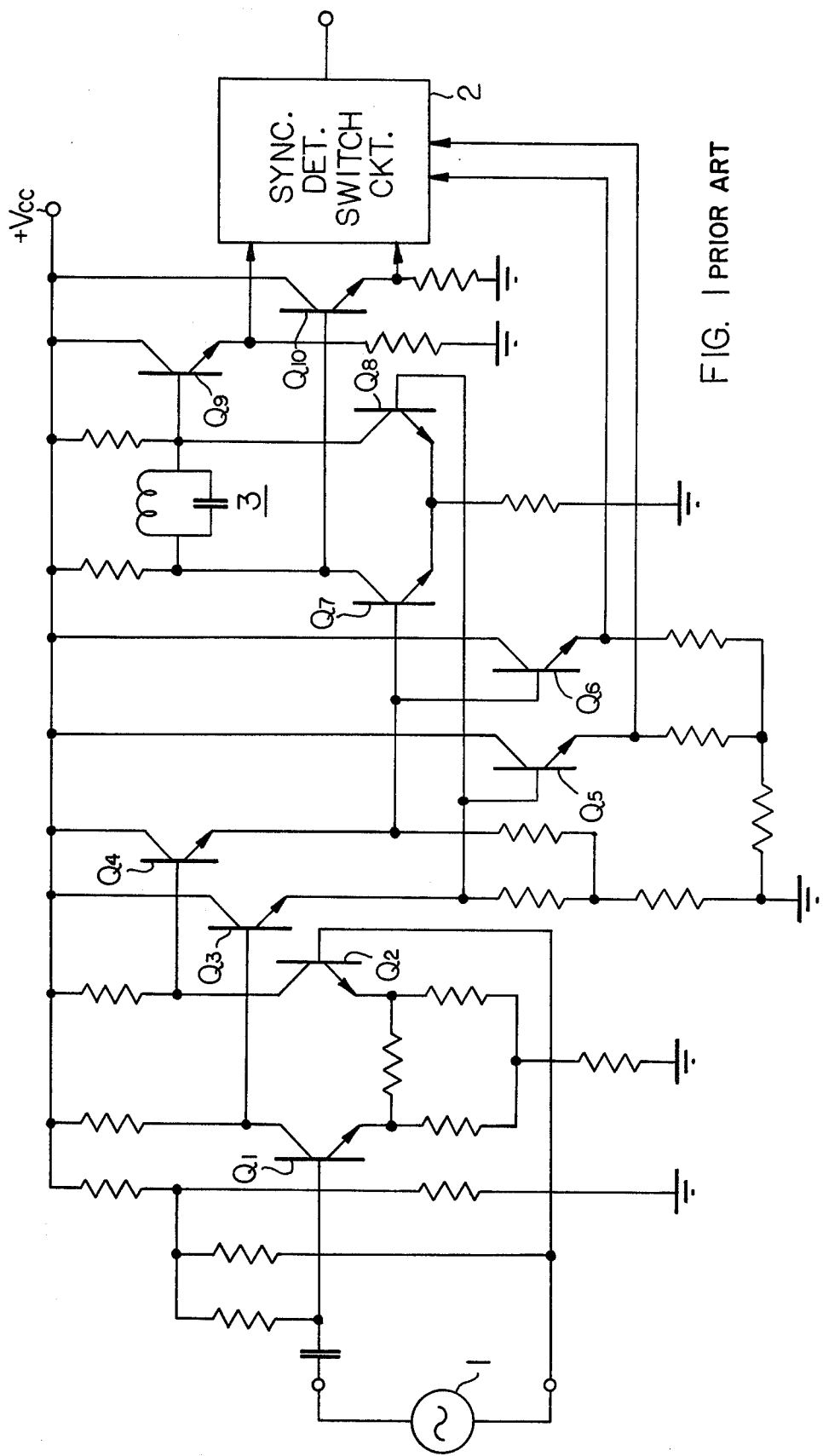
FIG. 1 is a schematic circuit diagram of a prior art synchronous detector circuit that does not include the advantages of the present invention.

FIG. 1 shows a prior art circuit. In FIG. 1, a video IF signal and a sound IF signal are supplied from a prior stage 1 to a differential amplifier composed of transistors $Q_1$ and $Q_2$. An amplified output signal from the differential amplifier is supplied to a switching circuit 2 for a synchronous detection through emitter follower buffer stages $Q_3$, $Q_4$ and $Q_5$, $Q_6$. The IF signal at the output of the buffer stage $Q_3$, $Q_4$ is amplified by a differential amplifier composed of transistors $Q_7$ and $Q_8$, and only a carrier component of the IF signal is extracted by a resonant circuit 3. This carrier component is supplied to the switching circuit 2 through a buffer stage $Q_9$, $Q_{10}$. In the switching circuit 2, the IF signal is synchronously detected by switching action and a video signal and a sound IF signal having the carrier frequency 4.5 MHz are obtained at the output of the switching circuit.

Since the IF signal is switched by the switching signal in the switching circuit 2, it is not necessary to use the non-linear characteristic of the transistor as a detector, and so, even if the sound IF signal in addition to the video IF signal is supplied to the switching circuit, the beat signal with the frequency of 920 KHz is eliminated in the detected video signal. Moreover, it is not necessary to use another detecting circuit for obtaining the sound IF signal with the frequency of 4.5 MHz.

However, in the circuit of FIG. 1, two signal paths to the switching circuit 2 are necessary. Those are: a first signal path for amplifying the IF signal and for obtaining the amplified IF signal, and another signal path for obtaining the carrier component from the IF signal. The circuit therefore has many circuit components and it is very difficult to produce this circuit in an integrated circuit. The circuit according to an embodiment of this invention shown on FIG. 2 overcomes the above defects in the prior art circuit.

In FIG. 2, transistors $Q_{11}$, $Q_{12}$ are connected to form a differential amplifier 11, and a resistor $R_1$ is connected as a constant current source between a common connection point of the emitters of the transistors $Q_{11}$, $Q_{12}$ and ground. The resistors $R_2$ and $R_3$ are connected to the collectors of the transistors $Q_{11}$, $Q_{12}$, respectively, as load resistors. From a prior stage 1, a video IF signal and a sound IF signal are supplied differentially to the bases of the transistors $Q_{11}$ and $Q_{12}$ through input terminals $T_1$ and $T_2$. Output signals at collectors of the transistors $Q_{11}$ and $Q_{12}$ are supplied through a pair of buffer transistors $Q_{13}$ and $Q_{14}$ to the switching circuit 2 for a synchronous detector.

Moreover, the emitters of two transistors $Q_{15}$ and $Q_{16}$, which are connected in common base configuration with their bases grounded through a capacitor $C_1$, are connected to the resistors $R_2$ and $R_3$. A tuned circuit 3, which includes a center-tapped coil $L_1$ in parallel with a capacitor and which resonates at the video intermediate frequency, and a resistor $R_4$ are connected between collectors of the transistors $Q_{15}$, $Q_{16}$. The center tap of the coil $L_1$ is connected to a power supply terminal $T_4$. Output signals at the collectors $Q_{15}$, $Q_{16}$ are supplied through buffer transistors $Q_{17}$ and $Q_{18}$ to the switching circuit 2 as a switching signal.

In this embodiment, the impedances of transistors $Q_{15}$ and $Q_{16}$ from the resistors $R_2$ and $R_3$ are so small, because they are emitter input impedances, that the AC loads of the transistors $Q_{11}$ and $Q_{12}$ are mainly the resistors $R_2$ and $R_3$. The IF signal is converted to a current signal and is amplified by the transistors $Q_{11}$ and $Q_{12}$, and this amplified current signal flows through the resistors $R_2$ and $R_3$. As a result, IF voltage signals, the amplitudes of which are dependent on the amplitudes of the current signals and the resistance values of the resistors $R_2$ and $R_3$, are obtained at the collectors of transistors $Q_{11}$ and $Q_{12}$. These voltage signals are supplied to the switching circuit 2 through the buffer transistors $Q_{13}$ and $Q_{14}$.

The current signals which flow through the transistors $Q_{15}$ and $Q_{16}$ are the same current signals as those that flow through the resistors $R_2$ and $R_3$ and are quite independent of the resistance values of the resistors $R_2$ and $R_3$. Therefore, the amplified IF current signals appear at the collectors of the transistors $Q_{15}$ and $Q_{16}$. Only carrier component of the video IF signal is extracted at the collectors of the transistors $Q_{15}$ and $Q_{16}$ by the resonant circuit 3 and the resistor $R_4$ as a voltage signal, and this voltage signal is supplied to the switching circuit 2 through the pair of buffer transistors $Q_{17}$ and $Q_{18}$.

Accordingly, in the switching circuit 2, the IF signal is synchronously detected by a switching operation, and a video signal and a sound IF signal (4.5 MHz) are obtained at the output terminal $T_3$.

As mentioned above in connection with FIG. 2, both the IF signal and the carrier component are amplified simultaneously, and fewer circuit components are necessary in this embodiment as compared with the circuit in FIG. 1, so that it is easier to fabricate the circuit of FIG. 2 in integrated circuit form.

In the embodiment of FIG. 2 all circuits are constructed for differential operation. FIG. 3 shows the same basic circuit in single-ended form.

In FIG. 3, the emitter of a transistor $Q_{21}$ is grounded through a capacitor $C_2$ and the collector of the transistor $Q_{21}$ is connected to the emitter of a transistor $Q_{22}$ through a resistor $R_5$. The base of the transistor $Q_{22}$ is grounded through a capacitor $C_3$ and the collector of that transistor is connected to a power supply terminal $T_4$ through a resonant circuit 3 and a resistor $R_4$. An IF signal from a preceding stage 1 is supplied to the base of the transistor $Q_{21}$ through an input terminal $T_1$, and an amplified IF signal is obtained at the collector of the transistor $Q_{21}$ and is supplied to the switching circuit 2 through a buffer stage (not shown). An amplified carrier component signal is obtained at the collector of the transistor $Q_{22}$ and is supplied to the switching circuit 2 through another buffer stage (not shown), and the synchronously detected signal from the switching circuit 2 is obtained at the output terminal $T_3$. The circuit in FIG. 3 is also very easy to fabricate as an integrated circuit because of the simplicity of the circuit.

What is claimed is:

1. An amplifier arrangement comprising:
   an amplifier stage including at least a common emitter transistor and first collector load means connected to the collector of said transistor;
   an input signal source connected to the base of said transistor;
   a grounded base stage including a common base transistor having its emitter connected to said first collector load means, and second collector load means connected to the collector of said common base transistor; and
   first and second output means connected with the collector of said common emitter transistor and the collector of said common base transistor, respectively.

2. An amplifier arrangement comprising:
   an amplifier stage including first transistor means and first collector load means connected thereto;
   a grounded base stage connected to said collector load means and including second transistor means and second collector load means connected thereto, said first collector load means being connected between said first transistor means and emitter input means of said second transistor means; and
   a synchronous detector switching circuit including a first input section connected to said first transistor means to obtain a signal therefrom to be synchronously detected, and a second input section connected to said second transistor means to obtain a switching signal therefrom synchronous with the signal to be synchronously detected.

3. The amplifier arrangement of claim 2 in which said first transistor means comprises a pair of differentially connected transistors and said second transistor means comprises a second pair of transistors each having its collector-emitter circuit connected in series with said first collector-load means.

4. The amplifier arrangement of claim 3 in which said second collector load means comprises a parallel tuned circuit tuned to the carrier frequency of the signal to be synchronously detected and comprising a capacitor and an inductor connected in parallel with each other and in series between the collectors of said second pair of transistors.

5. The amplifier arrangement of claim 4 in which said inductor has a center tap connected to a power supply terminal to supply electrical current to said amplifier stage and said grounded base stage.

6. An amplifier arrangement comprising:
   an amplifier stage including a first transistor connected in a grounded emitter circuit and first collector load means connected thereto;
   a grounded base stage connected to said collector load means and including a second transistor and second collector load means connected thereto, said first collector load means being connected between said first transistor and emitter input means of said second transistor; and
   a synchronous detector switching circuit including a first input section connected to the collector of the first transistor to obtain therefrom an amplitude modulated signal at a predetermined carrier frequency to be synchronously detected, and a second input section connected to the collector of said second transistor to obtain therefrom a switching signal synchronous with said signal to be synchronously detected.

7. The amplifier arrangement of claim 6 in which said second collector load means comprises a parallel tuned circuit tuned to the carrier frequency of said signal to be synchronously detected and comprising a capacitor connected in parallel with an inductor, said tuned circuit being connected in series between the collector of said second transistor and a power supply terminal to derive from said power supply terminal operating current for said amplifier stage and said grounded base stage.

* * * * *